(12) United States Patent
Lin

(10) Patent No.: US 9,136,661 B1
(45) Date of Patent: Sep. 15, 2015

(54) STORAGE DEVICE

(71) Applicant: PHISON ELECTRONICS CORP., Miaoli (TW)

(72) Inventor: Wei-Hung Lin, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/269,217

(22) Filed: May 5, 2014

(30) Foreign Application Priority Data

Mar. 21, 2014  (TW) .............................. 103204905 U

(51) Int. Cl.
  *H01R 31/06* (2006.01)
  *H01R 13/50* (2006.01)

(52) U.S. Cl.
  CPC ................ *H01R 31/06* (2013.01); *H01R 13/50* (2013.01)

(58) Field of Classification Search
  CPC .. H01R 31/06; H01R 31/065; H01R 13/6658; H01R 2107/00

USPC .......................... 439/638, 628, 660, 76.1, 630
  See application file for complete search history.

(56) References Cited

U.S. PATENT DOCUMENTS

| | | | |
|---|---|---|---|
| 7,872,873 B2 * | 1/2011 | Hiew et al. ..................... | 361/737 |
| 8,262,416 B2 * | 9/2012 | Nguyen et al. ................ | 439/660 |
| 8,393,907 B2 * | 3/2013 | Lin et al. .......................... | 439/81 |
| 8,686,600 B2 * | 4/2014 | Terlizzi et al. ................ | 307/125 |

* cited by examiner

*Primary Examiner* — Xuong Chung Trans
(74) *Attorney, Agent, or Firm* — Jianq Chyun IP Office

(57) ABSTRACT

A storage device including a storage module and a sheath member is provided. The storage module has a substrate, a first terminal set and a second terminal set, and the first and the second terminal sets are disposed on opposite sides of the substrate. The sheath member has an opening and a third terminal set. A portion of the third terminal set is exposed out of the sheath member. At least a portion of the storage module is sheathed into the sheath member, and the first terminal set is exposed out of the sheath member through the opening. The second terminal set is electrically connected to the third terminal set, and an connection interface is formed by the first terminal set exposed out of the sheath member and the portion of the third terminal set exposed out of the sheath member.

18 Claims, 7 Drawing Sheets

STORAGE DEVICE

CROSS-REFERENCE TO RELATED APPLICATION

This application claims the priority benefit of Taiwan application serial no. 103204905, filed on Mar. 21, 2014. The entirety of the above-mentioned patent application is hereby incorporated by reference herein and made a part of this specification.

FIELD OF THE INVENTION

The present invention relates to a storage device. More particularly, the present invention relates to a storage device having an adaptor structure for a connection interface.

DESCRIPTION OF RELATED ART

With development of multimedia technology, produced digital files become larger in size. Although a conventional 1.44 MB floppy disk is easy to carry, a capacity thereof cannot meet current needs. Moreover, although a conventional disk-structure type hard disk can provide a large storage space, it is inconvenient to carry due to its large size. Recently, with the popularization of universal serial bus (USB) interfaces and the price reduction of flash memories, USB flash disks advantaged in large storage capacity, great compatibility, and portability have been extensively applied to transmit data between various computers and storage devices.

However, there are various types of connectors for current electronic devices, and therefore, a flash disk which has only one connection interface will be limited in its applicability. Accordingly, how to broaden the application range of the flash disk by way of combining and converting flash memory having different connection interfaces has become a major subject to consider for persons skilled in the related art.

SUMMARY OF THE INVENTION

The present invention is directed to a storage device capable of providing different connection interfaces by using a sheath member together with terminal sets thereon.

The present invention is directed to a storage device including a storage module and a sheath member. The storage module has a substrate, a first terminal set and a second terminal set, and the first and the second terminal sets are disposed on opposite surfaces of the substrate. The sheath member has an opening and a third terminal set. A portion of the third terminal set is exposed out of the sheath member. At least a portion of the storage module is sheathed in the sheath member, such that the first terminal set is exposed out of the sheath member through the opening, and the second terminal set is electrically connected to the third terminal set. The first terminal set exposed out of the sheath member and the portion of the third terminal set exposed out of the sheath member form a first connection interface.

In an exemplary embodiment of the present invention, the storage module further includes a package body and a plurality of electronic elements. The electronic elements are disposed on the substrate. A portion of the substrate and the electronic elements are packaged in the package body. The first terminal set and the second terminal set are located out of the package body.

In an exemplary embodiment of the present invention, both the substrate and the package body are sheathed in the sheath member.

In an exemplary embodiment of the present invention, a portion of the substrate located out of the package body and a portion of the package body are sheathed in the sheath member.

In an exemplary embodiment of the present invention, the sheath member further has a main body and a pair of wing parts. The main body has the opening. The pair of wing parts extend from the main body and are away from the opening. When the first and the second terminal sets are moved into the sheath member with the substrate, the pair of wing parts sandwich opposite surfaces of the package body.

In an exemplary embodiment of the present invention, the sheath member further has an elastic piece located on one of the wing parts, and the package body has a hollow. When the first and the second terminal sets are moved into the sheath member with the substrate, the elastic piece is locked in the hollow to fix the storage module and the sheath member.

In an exemplary embodiment of the present invention, the sheath member further has an elastic piece, and the package body has a hollow. When the first and the second terminal sets are moved into the sheath member with the substrate, the elastic piece is locked in the hollow to fix the storage module and the sheath member.

In an exemplary embodiment of the present invention, the storage module further includes a plurality of electronic elements respectively disposed on the opposite surfaces of the substrate and located out of the sheath member.

In an exemplary embodiment of the present invention, wherein the sheath member further has a main body and a wing part. The main body has the opening. The wing part extends from the main body and is away from the opening. The first and the second terminal sets are moved into the sheath member with the substrate, and the wing part is connected to a pad on the substrate.

In an exemplary embodiment of the present invention, the sheath member further includes a main body. The main body has a containing space and the opening. The first terminal set and the second terminal set are moved into the containing space with the substrate, and the opening communicates the containing space and the outside.

In an exemplary embodiment of the present invention, the third terminal set has a first section, a second section and a third section. The second section is connected between the first section and the third section. The first section extends from the second section and is exposed out of the sheath member. The second section is embedded in the main body. The third section extends from the second section into the containing space. The second terminal set moved into the containing space is electrically connected with the third section correspondingly.

In an exemplary embodiment of the present invention, the opening and the third terminal set are located on opposite sides of the main body.

In an exemplary embodiment of the present invention, the storage module further includes a second connection interface disposed on one side opposite to the first connection interface and located out of the sheath member.

In an exemplary embodiment of the present invention, the second connection interface is formed by a plurality of terminals which is disposed on the substrate.

In an exemplary embodiment of the present invention, the second connection interface is formed by a plurality of terminals which is disposed on the substrate, the substrate has a plurality of pads, and the terminals are electrically connected to the substrate through the pads.

In an exemplary embodiment of the present invention, the second connection interface complies with a universal serial bus 2.0 (USB 2.0) standard.

In an exemplary embodiment of the present invention, the second connection interface complies with a universal serial bus 3.0 (USB 2.0) standard.

In an exemplary embodiment of the present invention, the storage device further includes a casing, and at least a portion of the storage module and the sheath member are contained in the casing.

To sum up, the storage module can be operated together with the sheath member, and thereby, the terminal sets of the storage module can achieve a conversion effect by means of the terminal sets of the sheath member. In other words, by sheathing the storage module in various sheath members with the terminal sets in the storage device, the storage module can use various terminals sets as connection interfaces to connect with other devices, so as to enhance the application range of the storage device.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
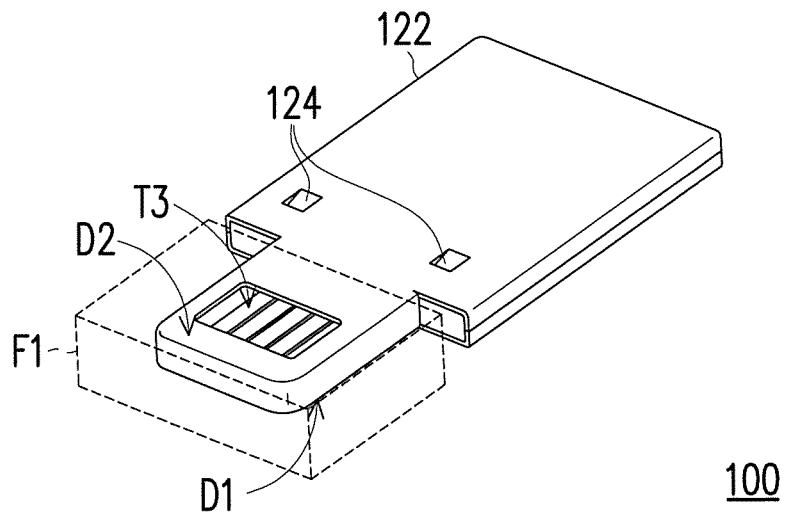
FIG. 1 is a schematic diagram of a storage device according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
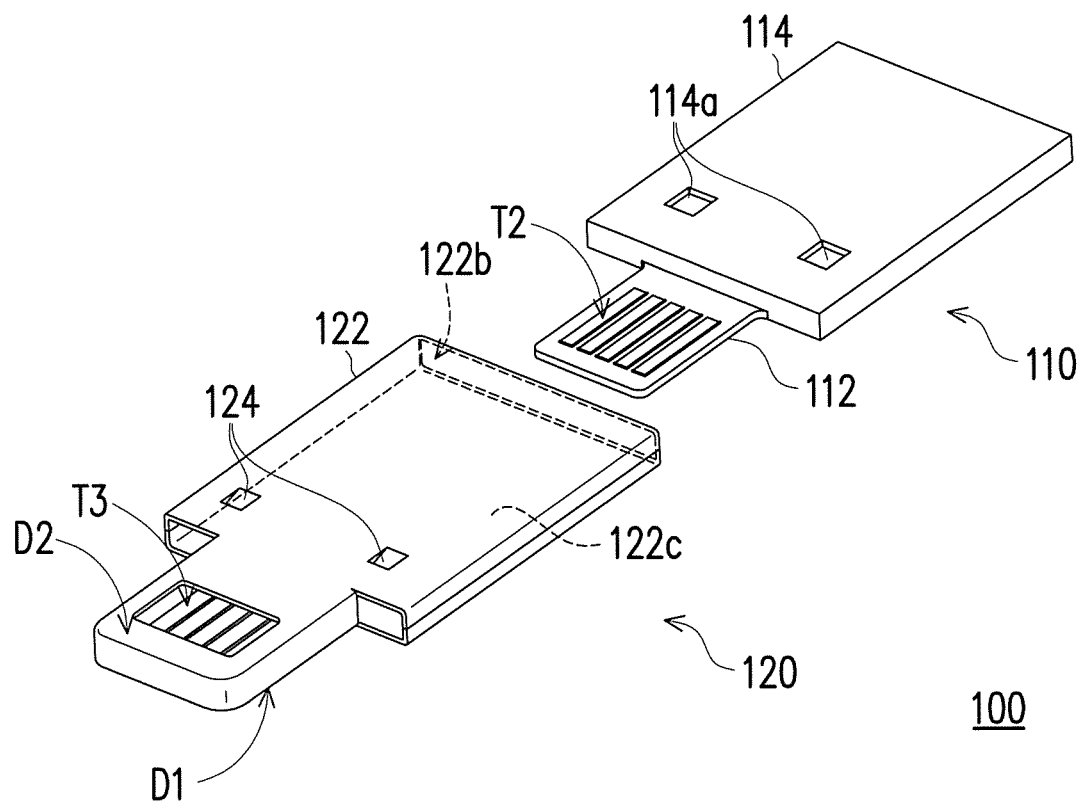
FIG. 2 is an exploded diagram of the storage device in FIG. 1.
Figure 3:
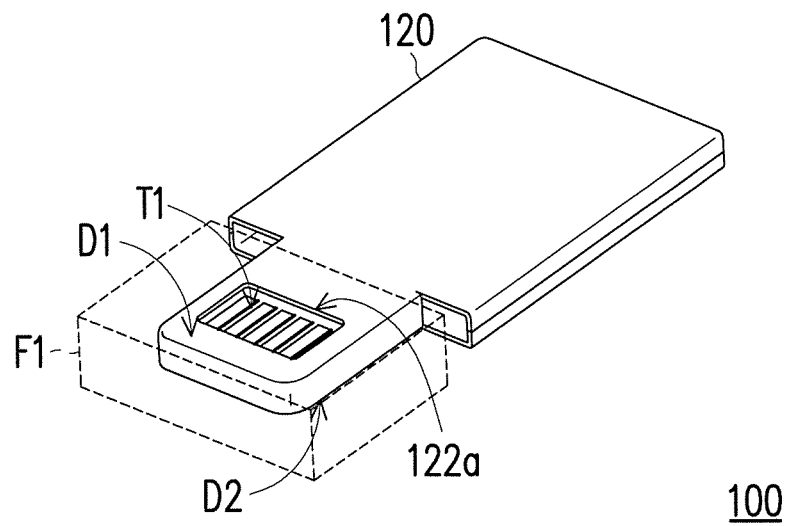
FIG. 3 illustrates the storage device of FIG. 1 in another view angle.
Figure 4:
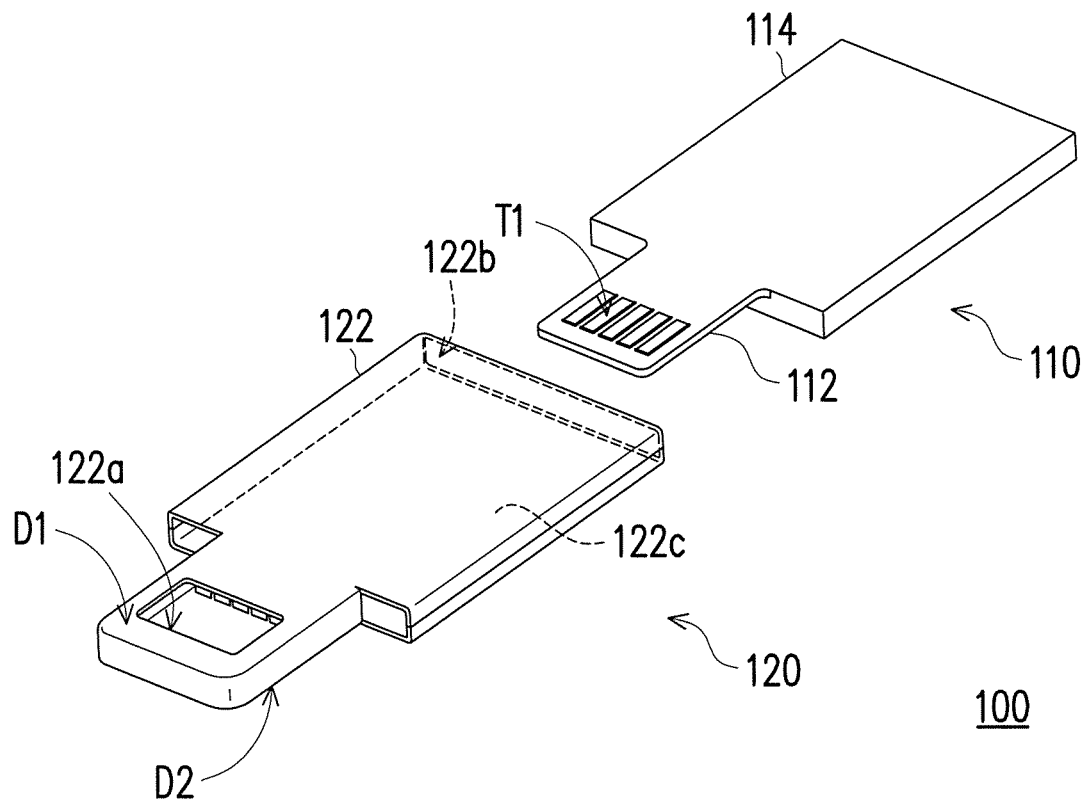
FIG. 4 is an exploded diagram of the storage device in FIG. 3.

FIG. 1 is a schematic diagram of a storage device according to an exemplary embodiment of the present invention. FIG. 2 is an exploded diagram of the storage device in FIG. 1. FIG. 3 illustrates the storage device of FIG. 1 in another view angle. FIG. 4 is an exploded diagram of the storage device in FIG. 3. Referring to FIGS. 1 through 4, in the present exemplary embodiment, a storage device 100 includes a storage module 110 and a sheath member 120. The storage module 110 has a substrate 112, a first terminal set T1 and a second terminal set T2. The first terminal set T1 and the second terminal set T2 are disposed on opposite surfaces of the substrate 112.

In the present exemplary embodiment, the storage module 110 also includes a package body 114, a portion of the substrate 112 is packaged in the package body 114, and the first terminal set T1 and the second terminal set T2 are located out of the package body 114. Furthermore, the storage module 110 is fabricated by a system in package (SIP) process. That is, in the package body 114, one or more dies as well as a package structure having any one or more of electronic elements, such as a passive element, a capacitor, a resistor, a connector, an antenna and so on (the electronic elements contained in the package body 114 are omitted in the illustrations of the present exemplary embodiment) are contained without packaging a region on the substrate 112 where the first terminal set T1 and the second terminal set T2 are disposed in the package body 114.

Additionally, the sheath member 120 includes a main body 122 and a third terminal set T3. The main body 122 has openings 122a and 122b and a containing space 122c. The openings 122a and 122b communicates the containing space 122c and the external environment. The opening 122a is located on a first side D1 of the main body 122. The terminal set T3 is embedded in the main body 122, and a portion thereof extends into the containing space 122c. The other portion of the third terminal set T3 is exposed out of the sheath member 120 from a second side D2. The first side D1 and the second side D2 opposite to each other with the containing space 122c therebetween. That is, the third terminal T3 and the opening 122a are located on opposite sides of the main body 122.

Referring to FIGS. 1 through 4, the substrate 112 and the package body 114 are completely contained in the containing space 122c through the opening 122b, such that the storage module 110 can be sheathed in the sheath member 120. After the first terminal set T1 is moved into the containing space 122c with the storage module 110, a portion of the first terminal set T1 is exposed out of the sheath member 120 through the opening 122a. Additionally, after the second terminal set T2 is moved into the containing space 122c, a portion of the second terminal set T2 is electrically connected with the third terminal set T3. Thus, the portion of the first terminal set T1 exposed out of the sheath member 120 and the portion of the third terminal set T3 exposed out of the sheath member 120 form a first connection interface F1, such that the storage module 110 can be transformed into another connection interface with the operation of the sheath member 120. In the present exemplary embodiment, the first connection interface F1 has a greater thickness structure than a connection interface originally formed by the substrate 112, the first terminal set T1 and the second terminal set T2, but nevertheless, the present invention is not limited thereto. Namely, a designer may provide the storage module with appropriate terminals based on structural characteristics of the sheath member 120 for the storage module 110 to perform interface conversion.

Figure 5:
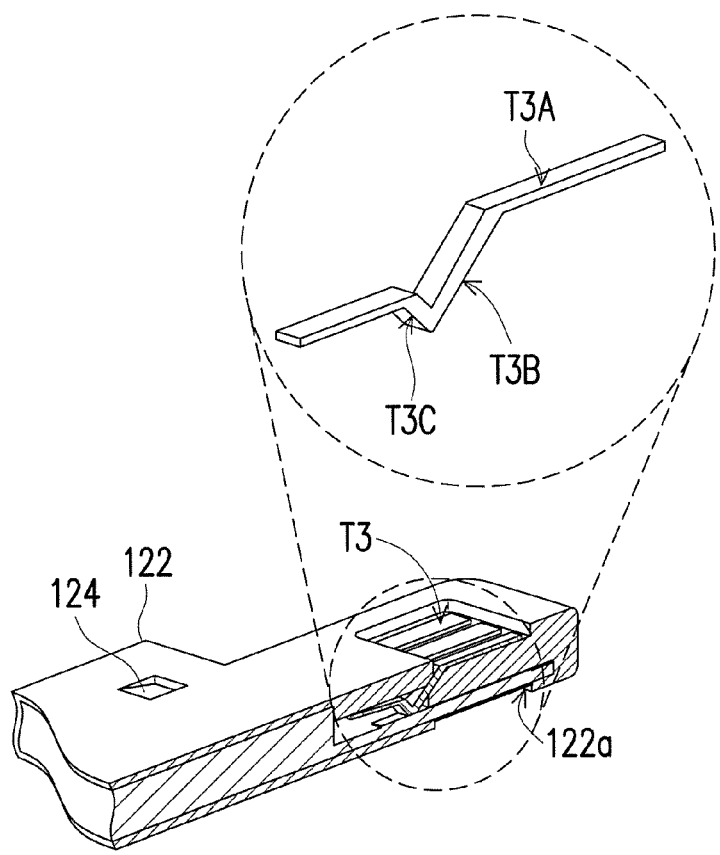
FIGS. 5 and 6 are partial schematic diagrams respectively illustrating the storage module and the sheath member in a connected state and a separated state.
Figure 6:
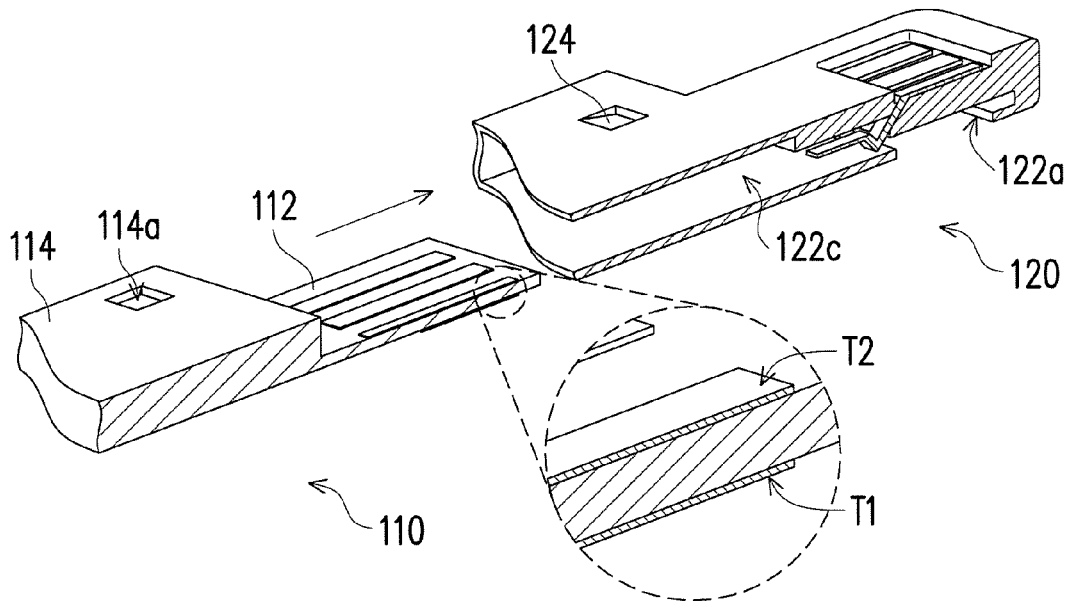

To be more detailed, FIGS. 5 and 6 are partial schematic diagrams respectively illustrating the storage module and the sheath member in a connected state and a separated state, where a terminal of the third terminal set T3 illustrated in FIG. 5 is enlarged. Referring to both FIGS. 5 and 6, each terminal of the third terminal set T3 has a first section T3A, a second section T3B and a third section T3C (where only one terminal of the third terminal set T3 is illustrated herein). In the present exemplary embodiment, the terminals of the third terminal set T3 may be assembled to the main body 122 by an insert molding or a casting means. The second section T3B connected between the first section T3A and the third section T3C is embedded in the main body 122. Additionally, the first section T3A extends from the second section T3B and is exposed out of the sheath member 120. The third section T3C extends from the second section T3B into the containing space 122c. Thus, the second terminal set T2 moved into the containing space 122c may be electrically connected with the third section T3C of the third terminal set T3 correspondingly, such that the third terminal set T3 may be considered as an extension structure of the second terminal set T2. It should be further mentioned that description related the structure with respect to the third terminal set T3 and the corresponding relation between the third terminal set T3 and the second terminal set T2 in embodiments below can be refer to the descriptions of the present exemplary embodiment and thus, will not be repeated hereinafter.

Moreover, referring to all FIGS. 1, 2, 5 and 6, in the present exemplary embodiment, the sheath member 120 further has an elastic piece 124 which is formed by, for example, punching and bending the sheath member 120. The elastic piece 124 tilts in a tilt direction oriented forward a direction of the storage module 110 moving into the containing space 122c. Additionally, the package body 114 has a hollow 114a. When the first terminal set T1 and the second terminal set T2 are moved into the containing space 122c with the substrate 112, the elastic piece 124 is locked in the hollow 114a by elasticity thereof after being pressed and deformed by the package body 114 so as to fix the storage module 110 and the sheath member 120 together.

Figure 7:
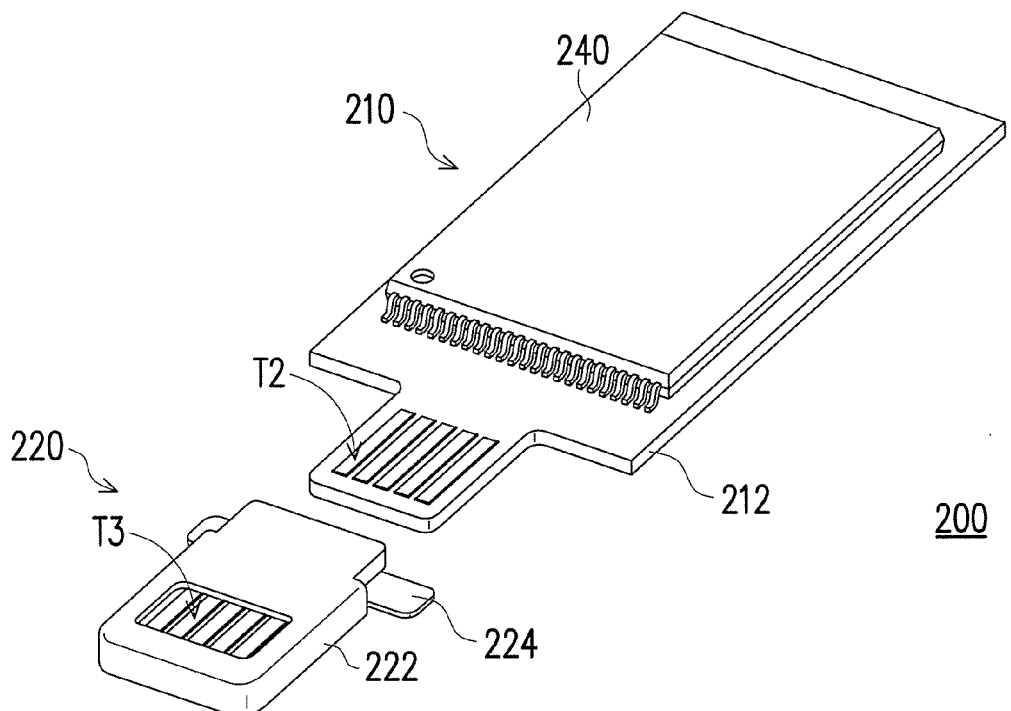
FIGS. 7 and 8 are exploded diagrams of a storage device according to another exemplary embodiment of the present invention.
Figure 8:
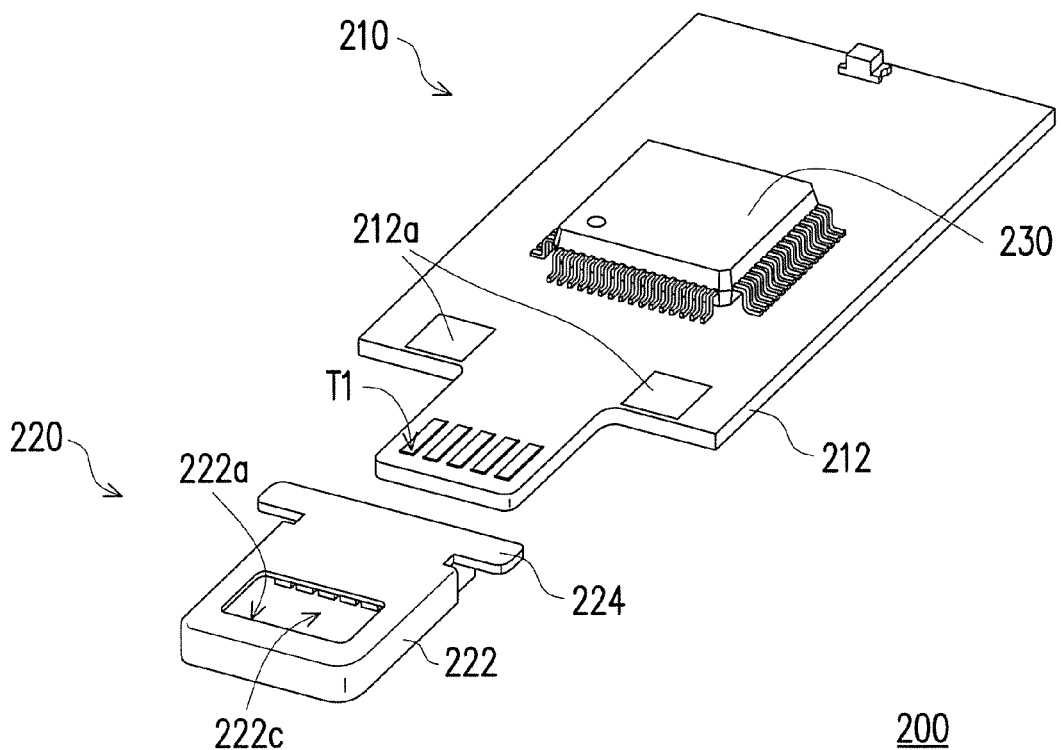

FIGS. 7 and 8 are exploded diagrams of a storage device according to another exemplary embodiment of the present invention, where the storage device is illustrated in opposite viewing angles for better distinguishing the elements. Being similar to the exemplary embodiment above, in a storage device 200 of the present exemplary embodiment, a first connection interface F1 is formed by connecting a storage module 210 with a sheath member 220 in the same way. The storage module 210 has a substrate 212, a first terminal set T1 and a second terminal set T2, and the first and the second terminal sets are disposed on the substrate 212 and located on opposite surfaces of the substrate 212. Nevertheless, differing from the exemplary embodiment above, in the present exemplary embodiment, the storage module 210 includes a plurality of electronic elements 230 and 240 (which are illustrated as a control element and a storage element disposed on the substrate for example, but construe no limitations to the present invention). The electronic elements 230 and 240 are respectively disposed on opposite surfaces of the substrate 212 and not packaged.

Similarly, the sheath member 220 includes a main body 222 and a third terminal set T3. The terminal set T3 is embedded in the main body 222, and a portion thereof extends into a containing space 222c. The other portion of the third terminal set T3 is exposed from the internal of the sheath member 220 and out of the sheath member 220. Description related to the structural dispositions of the main body 222 and the third terminal set T3 may refer to the description of the exemplary embodiment above and thus, will not repeated.

In the present exemplary embodiment, the storage module 210 is sheathed in the sheath member 220 with a portion of the substrate 212 (where the first terminal set T1 and the second terminal set T2 are disposed). After the first terminal set T1 is moved into the containing space 222c with the substrate 212, a portion of the first terminal set T1 is exposed out of the sheath member 220 through an opening 222a. Additionally, after the second terminal set T2 is moved into the containing space 222c, a portion of the second terminal set T2 is electrically connected with the third terminal set T3, such that likewise, the third terminal set T3 becomes an extension structure of the second terminal set T2. However, the electronic elements 230 and 240 disposed on the substrate 212 is still located out of the sheath member 220 without being moved into the containing space 222c.

Moreover, in the present exemplary embodiment, the sheath member 220 further has a wing part 224. The wing part 224 extends from the main body 222 and is away from the opening 222a. When the first terminal set T1 and the second terminal set T2 are moved into the containing space 222c with the substrate 212, the wing part 224 is connected to a pad 212a on the substrate 212. In other words, the present exemplary embodiment in different from the above exemplary embodiment in that the present exemplary embodiment utilizes the wing part directly welded on the pad 212a to fix the storage module 210 and the sheath member 220, rather than the fixing structure formed by the elastic piece 124 and the hollow 114a utilized by the above exemplary embodiment.

Figure 9:
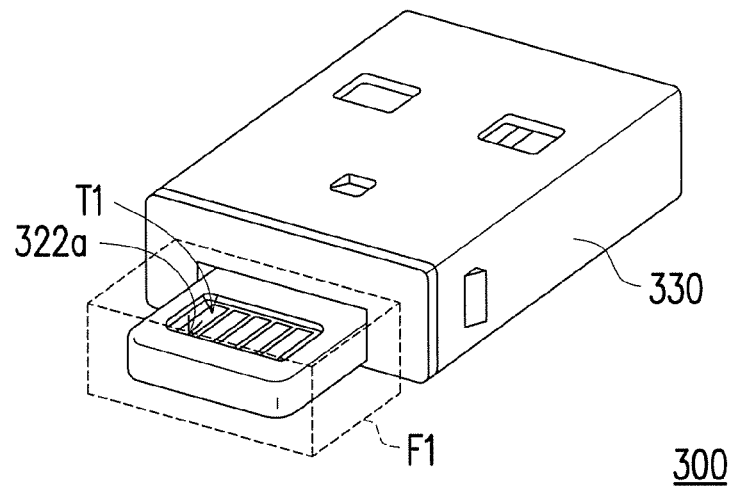
FIG. 9 is a schematic diagram of a storage device according to yet another exemplary embodiment of the present invention.
Figure 10:
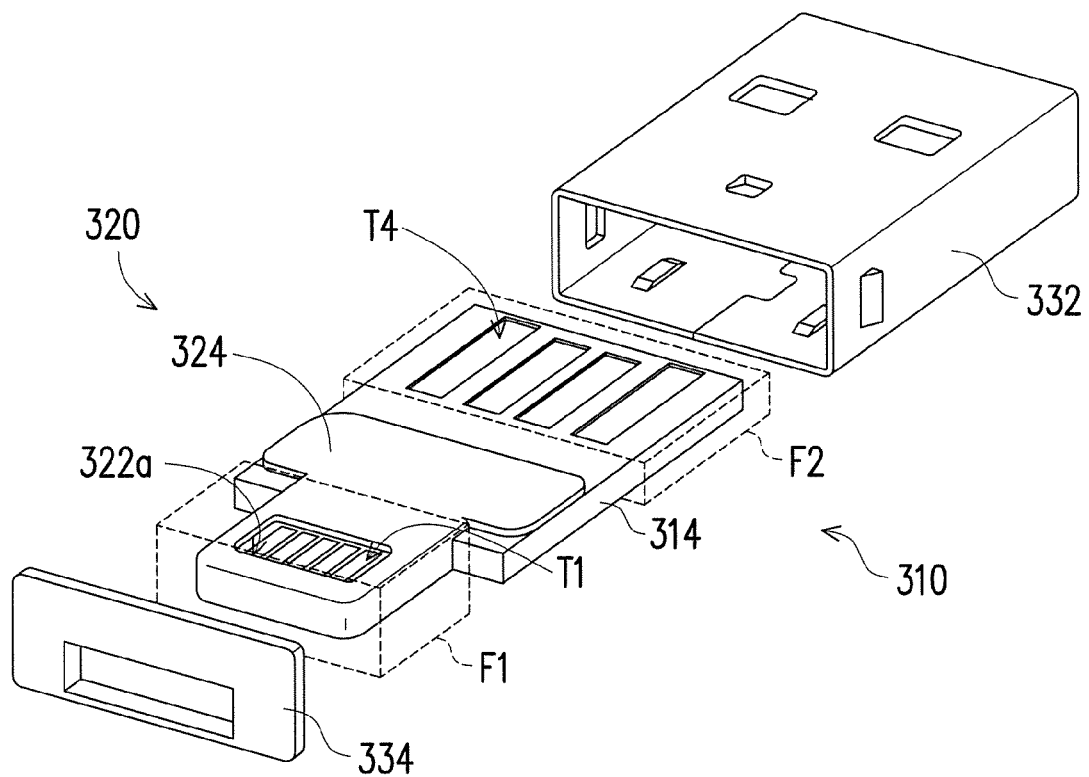
FIG. 10 is an exploded diagram of the storage device in FIG. 9.

FIG. 9 is a schematic diagram of a storage device according to yet another exemplary embodiment of the present invention. FIG. 10 is an exploded diagram of the storage device in FIG. 9. In the present exemplary embodiment, a storage device 300 includes a storage module 310 and a sheath member 320 and a casing 330. The casing 330 is constituted by a first unit 332 and a second unit 334, and the storage module 310 and the sheath member 320 are contained in the casing 330 after the storage module 310 is sheathed in the sheath member 320. The type of the casing is not limited in the present invention. In another exemplary embodiment that is not shown, the casing may be an integrated type structure, and the storage module 310 and the sheath member 320 that are sheathed together is installed in the casing 330 from a side having a larger opening.

Figure 11:
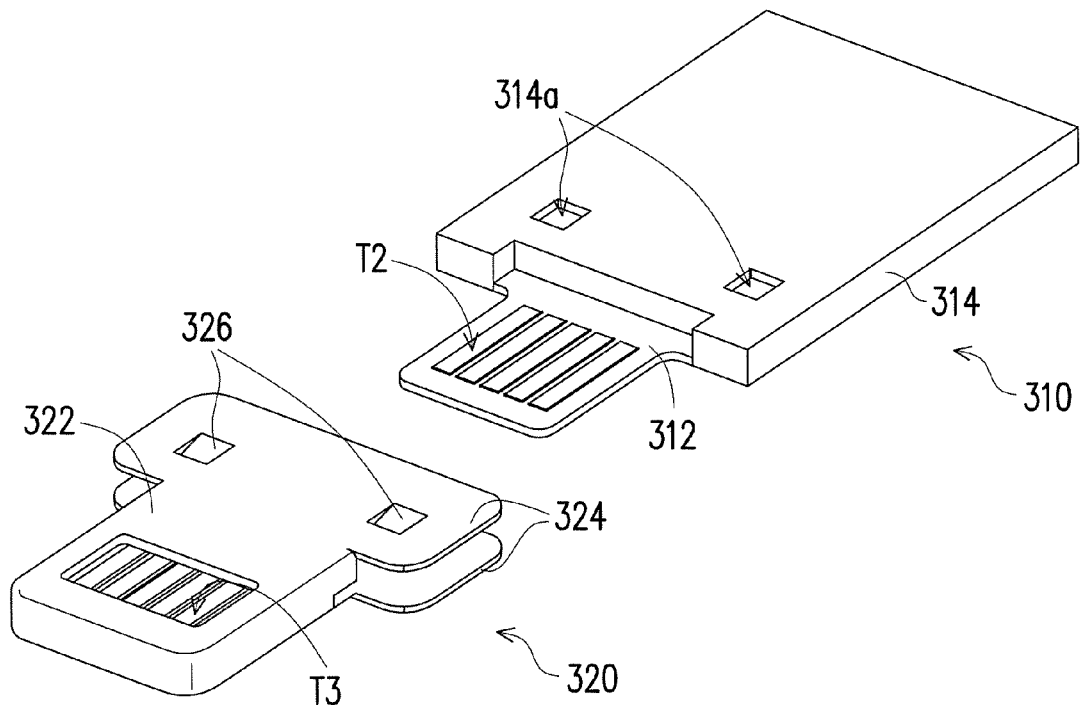
FIGS. 11 and 12 are partial schematic diagrams respectively illustrating the storage module and the sheath member in different angles.
Figure 12:
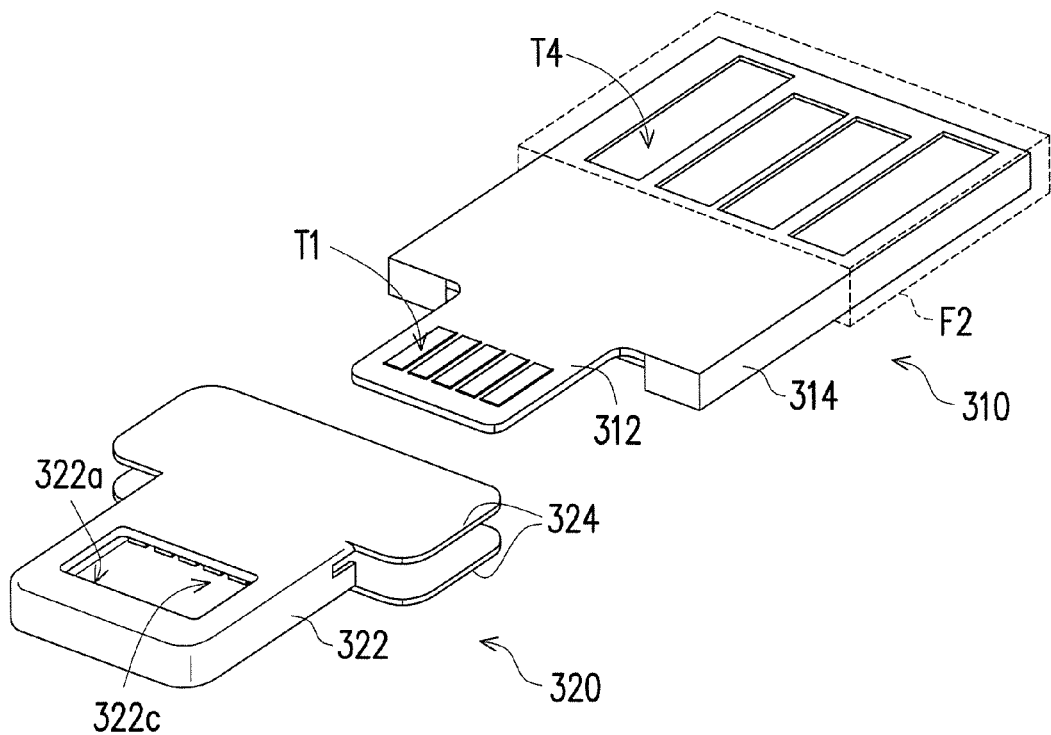

FIGS. 11 and 12 are partial schematic diagrams respectively illustrating the storage module and the sheath member in different angles. Referring to both FIGS. 9 and 12, in detail, the storage module 310 is similar to the packaged structure shown in FIG. 2. The difference lies in that in the present exemplary embodiment, the storage module 310 has a fourth terminal set T4 disposed on a side of a package body 314 which is away from the first terminal set T1 and the second terminal set T2, and the fourth terminal set T4 is disposed on the substrate 312 and on the same surface as the first terminal set T1. Thereby, a second connection interface F2 is formed. That is, the second connection interface F2 is disposed on a side opposite to the first connection interface F1 and located out of the sheath member 320. Referring to FIG. 12, the second connection interface F2 of the present exemplary embodiment complies with a universal serial bus 2.0 (USB 2.0) standard, but the present invention is not limited thereto.

Additionally, being similar to the exemplary embodiments above, the sheath member 320 includes a main body 322 and a third terminal set T3. The third terminal set T3 is embedded in the main body 322, a portion of the third terminal set T3 is exposed out of the main body 322, and the other portion thereof extends into a containing space 322c. Nevertheless, differing from the above exemplary embodiments, the sheath member 320 further has a pair of wing parts 324. The pair of wing parts 324 extend from the main body 322 and are away from an opening 322a. When the first terminal set T1 and the second terminal set T2 are moved into the main body 322 of the sheath member 320 with the substrate 312, the pair of wing parts 324 sandwich opposite surfaces of the package body 314. Namely, in the present exemplary embodiment, a portion of the substrate 312 located out of the package body 314 and a portion of the package body 314 are sheathed in the sheath member 320. Nevertheless, the present invention is not limited thereto, and in other exemplary embodiments that are not shown, only the portion of the substrate which is exposed out of the package body is sheathed in the sheath member.

Additionally, the sheath member 320 of the present exemplary embodiment also has an elastic piece 326 located on one of the wing parts 324, and the package body 314 has a hollow 314a. When the first terminal set T1 and the second terminal set T2 are moved into the containing space 322c with the substrate 312, not only the first terminal set T1 is exposed out of the sheath member 320 through the opening 322a and the second terminal set T2 is electrically connected with the third terminal set T3, but also the elastic piece 326 is locked in the hollow 314a, such that the storage module 310 and the sheath member 320 are fixed together. The corresponding relation among first terminal set T1, the second terminal set T2 and the third terminal set T3 in the present exemplary embodiment can refer to the descriptions of the above exemplary embodiments and thus, will not be repeated.

Figure 13:
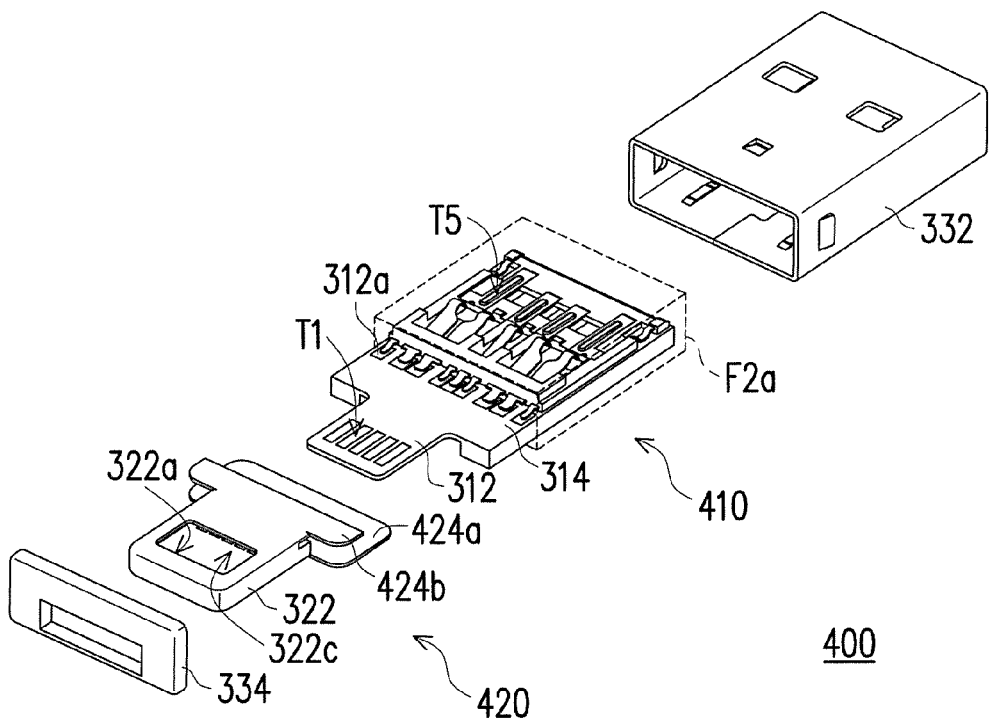
FIGS. 13 and 14 are exploded diagrams respectively illustrating a storage device of another exemplary embodiment in different angles.
Figure 14:
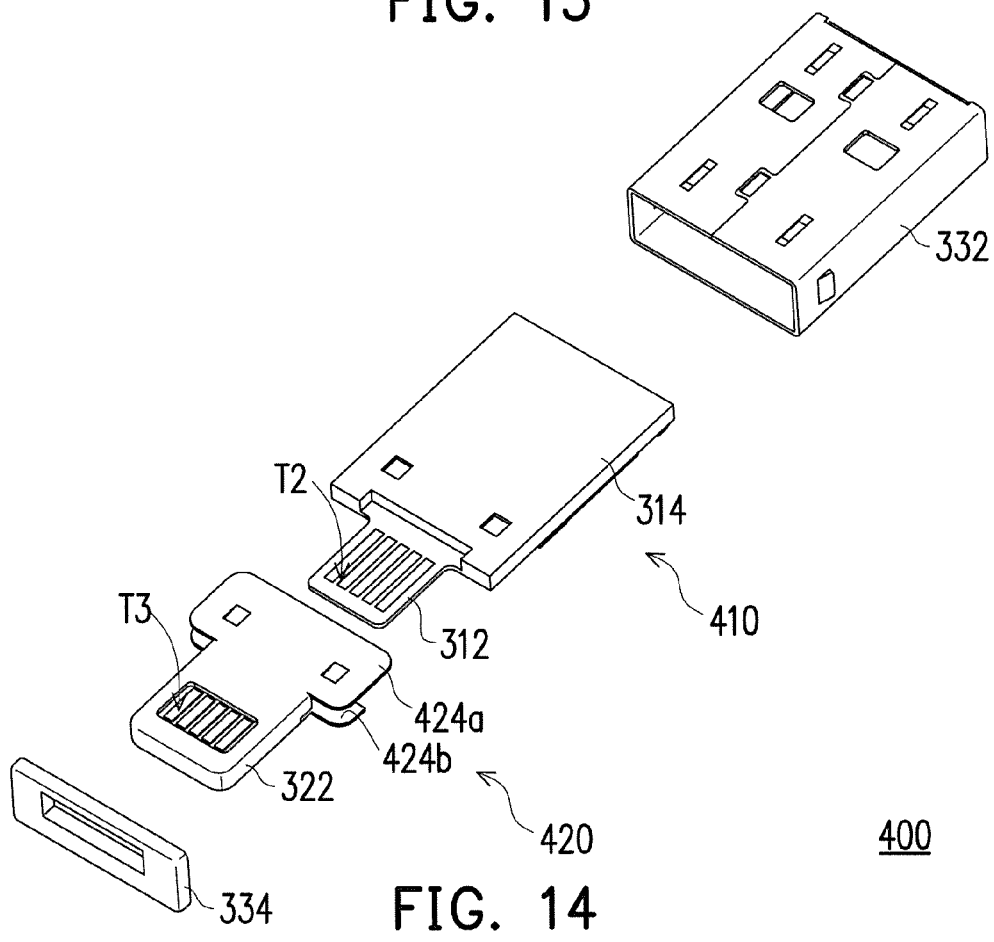

FIGS. 13 and 14 are exploded diagrams respectively illustrating a storage module of another exemplary embodiment in different angles. Referring to both FIGS. 13 and 14, in a storage device 400 of the present exemplary embodiment, being similar to the exemplary embodiment above, a storage module 410 and a sheath member 420 are likewise contained in the casing 330 formed by a first unit 332 and a second unit 334 after being sheathed together.

Nevertheless, differing from the above exemplary embodiments where the second connection interface F2 complies with the USB 2.0 standard, the second connection interface F2 of the present exemplary embodiment complies with a universal serial bus 3.0 (USB 3.0) standard. Referring to FIG. 13, in the present exemplary embodiment, the storage module 410 has a fifth terminal set T5 disposed on a side of the package body 314 which is away from the first terminal set T1 and the second terminal set T2, and the fifth terminal set T5 is disposed on the substrate 312 and on the same surface as the first terminal set T1 and has a plurality of terminals. A side of the terminals keeps electrically connected with the substrate 312 through the pad 312a, while the opposite side of the terminals serves as an interface to connect other electronic devices. The wing parts 424a and 424b also present a scenario that the wing part 424a has an area larger than the wing part 424b due to the terminal of the fifth terminal T5.

In light of the foregoing, the storage device formed by the storage module and the sheath member according to the exemplary embodiments of the present invention has been described above. With the structural characteristic (i.e., the opening) of the sheath member and the third terminal set disposed on the sheath member, the storage module can be electrically connected with the third terminal set by means of the first and the second terminal sets after the storage module is sheathed in the sheath member, and meanwhile, the third terminal set is exposed from the opening. In this way, the third terminal set becomes an extension structure of the second terminal set, and the third terminal set and the first terminal set exposed from the sheath member form the first connection interface. In other words, by means of using the sheath member together with the storage module in the storage device, the storage module can be connected with other devices by using various connection interfaces. Thereby, the application range of the storage device can be enhanced. The previously described exemplary embodiments of the present invention have many advantages, wherein the advantages aforementioned not required in all versions of the invention.

Although the present invention has been described with reference to the embodiments thereof, it will be apparent to one of the ordinary skills in the art that modifications to the described embodiments may be made without departing from the spirit of the invention. Accordingly, the scope of the invention will be defined by the attached claims not by the above detailed description.

What is claimed is:

1. A storage device, comprising:
    a storage module, having a substrate, a first terminal set and a second terminal set, wherein the first and the second terminal sets are disposed on opposite surfaces of the substrate; and
    a sheath member, having an opening and a third terminal set, wherein a portion of the third terminal set is exposed out of the sheath member, at least a portion of the storage module is sheathed in the sheath member such that the first terminal set is exposed out of the sheath member through the opening, the second terminal set is electrically connected to the third terminal set, and the first terminal set exposed out of the sheath member and the portion of the third terminal set exposed out of the sheath member form a first connection interface.

2. The storage device according to claim 1, wherein the storage module further comprises a package body and a plurality of electronic elements, the electronic elements are disposed on the substrate, a portion of the substrate and the electronic elements are packaged in the package body, and the first terminal set and the second terminal set are located out of the package body.

3. The storage device according to claim 2, wherein both the substrate and the package body are sheathed in the sheath member.

4. The storage device according to claim 2, wherein a portion of the substrate located out of the package body and a portion of the package body are sheathed in the sheath member.

5. The storage device according to claim 4, wherein the sheath member further has a main body and a pair of wing parts, the main body has the opening, the pair of wing parts extend from the main body and are away from the opening, the first terminal set and the second terminal set are moved into the main body with the substrate, and the pair of wing parts sandwich opposite surfaces of the package body.

6. The storage device according to claim 5, wherein the sheath member further has an elastic piece located on one of the wing parts, the package body has a hollow, and when the first and the second terminal sets are moved into the sheath member with the substrate, the elastic piece is locked in the hollow to fix the storage module and the sheath member.

7. The storage device according to claim 2, wherein the sheath member further has an elastic piece, the package body has a hollow, and when the first and the second terminal sets are moved into the sheath member with the substrate, the elastic piece is locked in the hollow to fix the storage module and the sheath member.

8. The storage device according to claim 1, wherein the storage module further comprises a plurality of electronic elements respectively disposed on the opposite surfaces of the substrate and located out of the sheath member.

9. The storage device according to claim 8, wherein the sheath member further has a main body and a wing part, the main body has the opening, the wing part extends from the main body and is away from the opening, the first terminal set and the second terminal set are moved into the main body with the substrate, and the wing part is connected to a pad on the substrate.

10. The storage device according to claim 1, wherein the sheath member comprises:
a main body, having a containing space and the opening, the first terminal set and the second terminal set are moved into containing space with the substrate, and the opening communicates the containing space and the outside.

11. The storage device according to claim 10, wherein the third terminal set has a first section, a second section and a third section, the second section is connected between the first section and the third section, the first section extends from the second section and is exposed out of the sheath member, the second section is embedded in the main body, the third section extends from the second section into the containing space, and the second terminal set moved into the containing space is electrically connected with the third section correspondingly.

12. The storage device according to claim 10, wherein the opening and the third terminal set are located on opposite sides of the main body.

13. The storage device according to claim 1, wherein the storage module further comprises a second connection interface disposed on one side opposite to the first connection interface and located out of the sheath member.

14. The storage device according to claim 13, wherein the second connection interface is formed by a plurality of terminals which is disposed on the substrate.

15. The storage device according to claim 13, wherein the second connection interface is formed by a plurality of terminals which is disposed on the substrate, the substrate has a plurality of pads, and the terminals are electrically connected to the substrate through the pads.

16. The storage device according to claim 14, wherein the second connection interface complies with a universal serial bus 2.0 (USB 2.0) standard.

17. The storage device according to claim 15, wherein the second connection interface complies with a universal serial bus 3.0 (USB 3.0) standard.

18. The storage device according to claim 1, further comprising:
a casing, containing at least a portion of the storage module and the sheath member.

* * * * *